(12) United States Patent
Wilson et al.

(10) Patent No.: US 12,029,018 B2
(45) Date of Patent: Jul. 2, 2024

(54) ELECTROMAGNETIC SHIELDING FOR ELECTRIC VEHICLES

(71) Applicant: Auria Solutions UK I, Ltd., London (GB)

(72) Inventors: Ernest Franklin Wilson, Albemarie, NC (US); Timothy Joel Allison, Marion, NC (US); Eric Staudt, Fletcher, NC (US)

(73) Assignee: AURIA SOLUTIONS UK 1 LTD., London (GB)

( * ) Notice: Subject to any disclaimer, the term of this patent is extended or adjusted under 35 U.S.C. 154(b) by 0 days.

(21) Appl. No.: 18/153,533

(22) Filed: Jan. 12, 2023

(65) Prior Publication Data

US 2023/0225095 A1    Jul. 13, 2023

Related U.S. Application Data

(60) Provisional application No. 63/298,731, filed on Jan. 12, 2022.

(51) Int. Cl.
| | |
|---|---|
| *H05K 9/00* | (2006.01) |
| *B32B 3/26* | (2006.01) |
| *B32B 5/06* | (2006.01) |
| *B32B 5/18* | (2006.01) |
| *B32B 7/12* | (2006.01) |
| *B32B 15/04* | (2006.01) |
| *B32B 15/14* | (2006.01) |
| *B32B 37/12* | (2006.01) |
| *B32B 37/16* | (2006.01) |
| *B60R 13/08* | (2006.01) |

(52) U.S. Cl.
CPC ............ *H05K 9/0081* (2013.01); *B32B 3/266* (2013.01); *B32B 5/06* (2013.01); *B32B 5/18* (2013.01); *B32B 7/12* (2013.01); *B32B 15/046* (2013.01); *B32B 15/14* (2013.01); *B32B 37/12* (2013.01); *B32B 37/16* (2013.01); *B60R 13/08* (2013.01); *B32B 2305/022* (2013.01); *B32B 2305/18* (2013.01); *B32B 2307/212* (2013.01); *B32B 2307/72* (2013.01); *B32B 2307/732* (2013.01); *B32B 2605/003* (2013.01)

(58) Field of Classification Search
CPC .................................................. H05K 9/0086
See application file for complete search history.

(56) References Cited

U.S. PATENT DOCUMENTS

| | | | |
|---|---|---|---|
| 2003/0116379 A1 | 6/2003 | Khambete et al. | |
| 2006/0090832 A1 | 5/2006 | Allison et al. | |
| 2008/0283290 A1* | 11/2008 | Niino | H05K 9/0001 |
| | | | 174/350 |
| 2010/0214713 A1 | 8/2010 | Song | |

(Continued)

OTHER PUBLICATIONS

International Search Report and Written Opinion of International Application No. PCT/US23/60527, mail date Apr. 25, 2023, 10 pages.

*Primary Examiner* — Hung V Ngo
(74) *Attorney, Agent, or Firm* — Grossman, Tucker, Perreault & Pfleger PLLC; Steven J. Grossman

(57) ABSTRACT

The present invention is directed at electromagnetic shielding that is particularly suitable for applications in electric vehicles. The electromagnetic shielding is relatively lightweight and can be integrated into a carpet or textile type construction.

24 Claims, 4 Drawing Sheets

(56) References Cited

U.S. PATENT DOCUMENTS

| | | | |
|---|---|---|---|
| 2010/0288582 A1* | 11/2010 | May | B32B 9/02 |
| | | | 181/286 |
| 2012/0321877 A1 | 12/2012 | Whitesell et al. | |
| 2014/0346815 A1 | 11/2014 | Keutz et al. | |
| 2015/0195960 A1* | 7/2015 | Seki | H01M 10/6561 |
| | | | 361/690 |
| 2016/0024708 A1* | 1/2016 | McGill | B32B 5/245 |
| | | | 428/95 |
| 2017/0360274 A1 | 12/2017 | Love et al. | |
| 2020/0146191 A1 | 5/2020 | Toyoda et al. | |
| 2020/0198512 A1* | 6/2020 | Tanaka | B60L 50/66 |
| 2020/0406803 A1 | 12/2020 | Hernandez Covarrubias et al. | |
| 2021/0367416 A1 | 11/2021 | Hebert | |

* cited by examiner

ELECTROMAGNETIC SHIELDING FOR ELECTRIC VEHICLES

FIELD

The present invention is directed at electromagnetic shielding that is particularly suitable for applications in electric vehicles. The electromagnetic shielding is relatively lightweight and can be integrated into a carpet or textile type construction.

BACKGROUND

With the introduction and global expansion of electric vehicles, the automotive industry is experiencing a need to shield electromagnetic fields, and in particular electromagnetic fields developed at currents at 100 kHz and $4A_{rms}$. Full body battery systems and electric motors are potential sources for such concerns. In recent electric vehicle designs battery systems and electric motors may be positioned below flooring, cargo management locations, trunks and frunks (front trunk locations). The emission of electron-magnetic interference from such components is a growing concern for interference of other electrical components in the vehicle, operation and charging of communication devices, and is a potential concern for vehicle occupants.

SUMMARY

A multilayer laminate construction for electric vehicle flooring comprising a foam or fiber decoupling layer, a perforated metallic electromagnetic shield layer having a plurality of openings, a layer of tufted carpet or needled carpet, wherein said multilayer construction provides electromagnetic shielding in the electric vehicle flooring.

A method of forming a multilayer laminate construction for electric vehicle flooring comprising providing a perforated metallic electromagnetic shield layer having a first side and a second side and having a plurality of openings and providing a layer of tufted carpet or needled carpet. This is followed by forming a foam layer on a first side of said perforated electromagnetic shield layer where the foam penetrates the openings in said perforated electromagnetic shield layer. The foam penetrating the openings may then adhere to said layer of tufted carpet or needled carpet or to an upper layer of the multilayer laminate positioned above the perforated electromagnetic shield layer and between the perforated electromagnetic shield layer and the tufted carpet or needled carpet.

DESCRIPTION OF PREFERRED EMBODIMENTS

Figure 1:
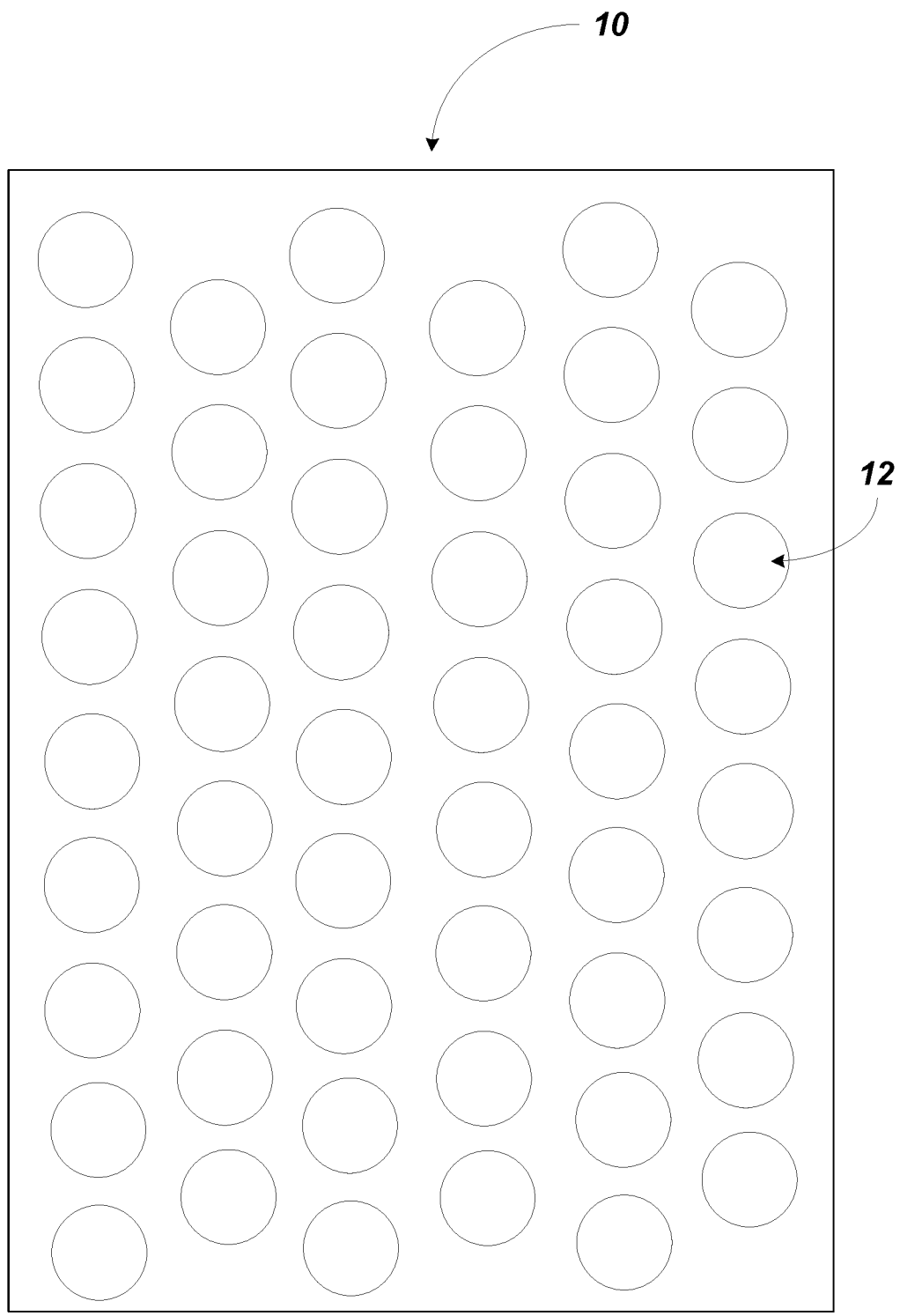
FIG. 1 is a view of the perforated metallic shield layer.

FIG. 1 provides a view of the perforated metallic electromagnetic shield layer 10 herein that includes a plurality of openings 12 for use in a laminate type construction. The metal material is preferably aluminum. The openings in the perforated metallic electromagnetic shield layer 10 are preferably in the form of a round hole, although other opening geometries are contemplated, such as oval, square, rectangular or triangular. The perforated metallic electromagnetic shield layer 10 preferably has a thickness in the range of 0.025 mm to 1.5 mm, including all individual values and increments therein, such as a thickness of 0.025 mm to 0.64 mm or 0.025 mm to 0.13 mm. The openings 12 preferably range from 1.5 mm in smallest diameter to 10.0 mm in largest diameter including all individual values and increments therein. Preferably, the open area in the metallic electromagnetic shield layer 10 (due to the collective presence of the plurality of openings 12) ranges from 5% to 50% including all individual values and increments therein. As may be appreciated, the presence of such openings in the perforated metallic electromagnetic shield layer 10 then serves to reduce the ensuing weight of layer 10 when utilized in a laminate type construction (e.g. carpet or textile) and retain the performance as an electromagnetic shield suitable for use within an electric vehicle, and in particular, electric vehicle flooring within the vehicle interior and visible to the vehicle occupants.

Various laminate constructions can now be formed herein with the perforated metallic electromagnetic shield layer 10. Accordingly, the present invention stands directed at multilayer laminate constructions, particularly suitably for use as flooring in an electric vehicle, to reduce the electromagnetic field. Such multilayer laminate constructions will now include at least a fiber or foam decoupling layer, the perforated electromagnetic shield layer described herein and one or more upper layers which include at least one layer of a tufted carpet and/or needled carpet. Tufted carpet is reference to looped carpet fibers that extend through a carpet backing. Needled carpet is reference to staple fibers that are mechanically entangled by forked or barbed needles that are repeatedly punched through the fiber structure to mechanically tangle the fibers to produce a carpet structure. Reference to a decoupling layer is reference to the feature that such layer decouples the multi-layer structure from the vibrations in the vehicle sheet metal or other surface. The decoupling feature therefore makes it relatively harder for sound to pass through the layer when utilized in a vehicle.

Figure 2:
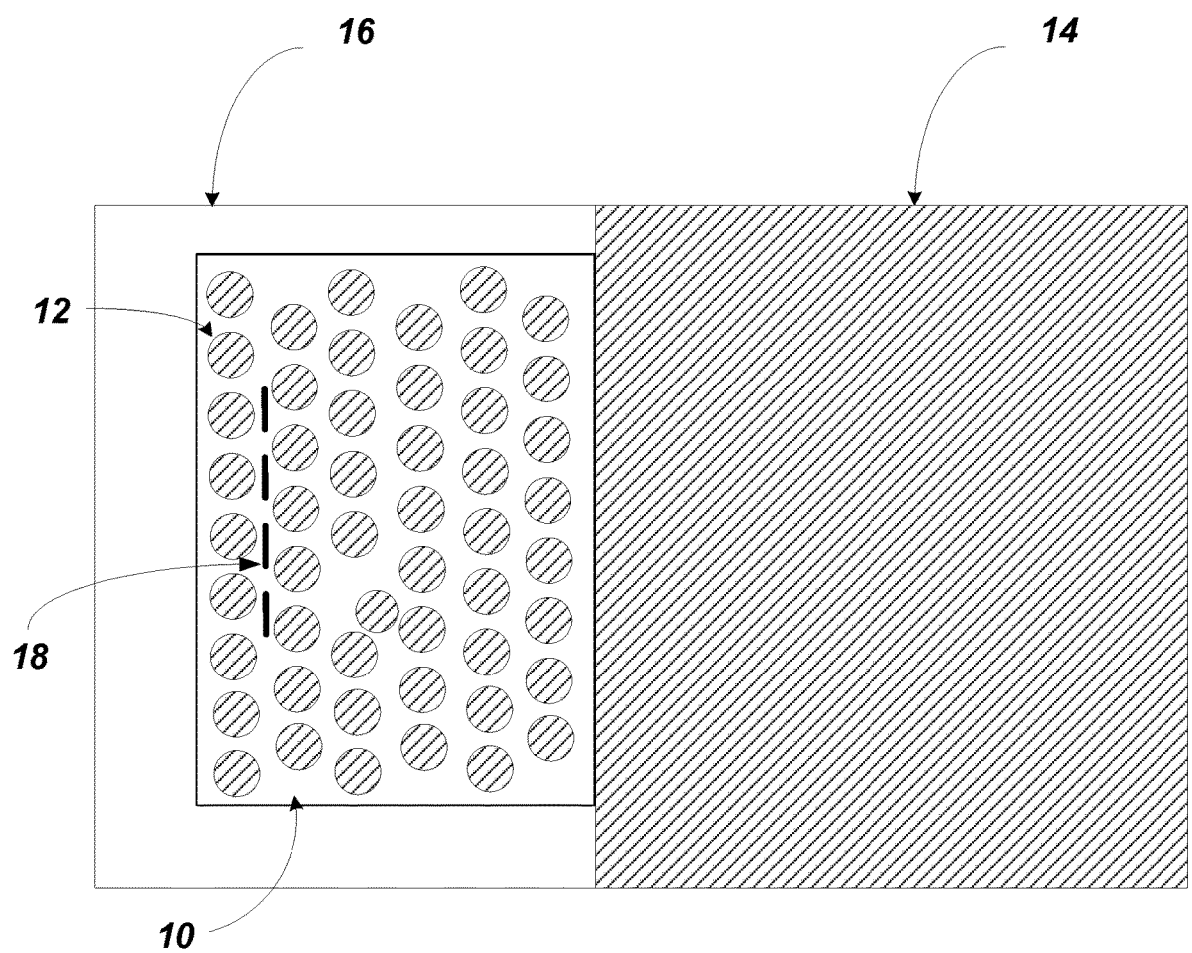
FIG. 2 is a cut-away view of a first preferred multilayer laminate construction herein.

FIG. 2 provides a cut-away view of a first preferred multilayer laminate construction herein. The bottom decoupler layer 14 may be sourced from fiber or foam but is preferably of foam and would generally extend along the entire bottom of the laminate. The perforated metallic electromagnetic shield layer 10 is shown where the foam 14, during the step of foaming, flows through the holes of the metallic electromagnetic shield layer 10 and preferably adheres to an upper scrim (nonwoven) backing of an upper carpet layer 16, which carpet layer may be a tufted (needled) or nonwoven carpet. The perforated metallic electromagnetic shield layer 10 is preferably aluminum and is present at a thickness of 0.025 to 0.64 mm, more preferably 0.025 mm to 0.13 mm. Other contemplated metals include copper, brass, nickel, silver, steel and tin. The scrim backing of the carpet layer 16 may preferably have a basis weight of 12 g/m² to 800 g/m². The foam density is preferably in the range of 10 kg/m³ to 150 kg/m³ and the foam is preferably present at a thickness of 1.0 mm to 100.0 mm. More preferably, the foam density is in the range of 45 kg/m³ to 75 kg/m³. The foam is preferably sourced from polyurethane, polyethylene, polystyrene, and/or ethylene-vinyl acetate copolymers. In FIG. 2, it can be appreciated that during a foam formation step, the foam will penetrate into the holes 12 and then adhere to the carpet layer 16. One or a plurality of adhesive strips 18 may optionally be placed on one or both sides of the metallic electromagnetic shield layer 10 to further ensure bonding of the metallic electromagnetic shield layer 10 with the scrim backing of upper carpet layer 16 and/or lower foam layer 14. The upper carpet layer 16 preferably has a thickness in the range of 2.0 mm to 12.5 mm and may include a tufted carpet or needled carpet.

Figure 3:
FIG. 3 provides a cross-sectional view of a preferred multilayer laminate construction herein.

FIG. 3 provides a cross-sectional view of another preferred multilayer laminate construction herein. In particular, the preferred configuration includes layer 15 which may again be a foam or fiber decoupler. In the case of a fiber decoupler, the fiber density is preferably in the range of 30 $kg/m^3$ to 150 $kg/m^3$ including all individual values and increments therein. More preferably, the fiber decoupler layer 15 has a density in the range of 50 $kg/m^3$ to 80 $kg/m^3$. The fiber decoupler layer preferably has a thickness of 1.0 mm to 100.0 mm. The fiber decoupler layer may be sourced from cotton, polyester, wool, acrylic, polypropylene, rayon, polyamide (nylon), along with filler fibers that are commonly identified as shoddy fibers. The fiber decoupler layer may also include bicomponent binder fibers. The fiber decoupler may preferably be formed via an airlay process, card-cross lap process, or shoot feed airlay process. When layer 15 is a foam layer, the foam density is again preferably in the range of 10 $g/m^3$ to 150 $kg/m^3$ including all individual values and increments therein. More preferably, the foam layer has a density in the range of 45 $kg/m^3$ to 75 $kg/m^3$. The foam layer preferably has a thickness in the range of 1.0 mm to 100.0 mm and may be sourced from polyurethane, polyethylene, polystyrene, and/or ethylene-vinyl acetate copolymers. The foam may be open cell or closed cell or a mixture of open and close cell structure. As noted above, when layer 15 is a foam layer, it will adhere in this embodiment during foam formation to the perforated metallic electromagnetic shield layer 10 as well as the barrier film layer 20.

As also can be seen in FIG. 3, the perforated metallic electromagnetic shield layer 10 is again preferably aluminum and is present at a thickness of 0.025 mm to 0.64 mm, more preferably 0.025 mm to 0.13 mm. This then is followed by a barrier film layer 20 that has a thickness in the range of 0.012 mm to 0.25 mm. This then is followed by a bonding layer 22 having a thickness in the range of 0.1 mm to 1.5 mm at a basis weight of 50 $g/m^2$ to 700 $g/m^2$. The bonding layer is preferably sourced from polyethylene at a melt flow index of 10 to 600 and is particularly suitable for bonding of the loops of a tufted carpet layer. Other polymers for the bonding layer preferably include polyester, polyamide, polyurethane, ethylene-vinyl acetate copolymer, amorphous poly-alpha-olefin (APAO) polymer. The bonding layer may preferably be applied in a wet coat latex or emulsion process, a melting and extrusion process, a roll coat process or a spray-on process. The upper layer 24 is preferably either a tufted carpet at a preferred thickness of 2.0 mm to 12.5 mm and basis weight of 230 $g/m^2$ to 700 $g/m^2$ or a needled (nonwoven) carpet also at a thickness of 2.0 mm to 12.5 mm and at a basis weight of 200 $g/m^2$ to 2000 $g/m^2$.

Figure 4:
FIG. 4 provides another cross-sectional view of a preferred multilayer laminate construction herein.

FIG. 4 illustrates another cross-sectional view of a preferred multilayer laminate construction herein having fiber or foam layer 15, perforated metallic electromagnetic shield layer 10, bonding layer 20 and upper layer 24 as described in FIG. 3 above. Unlike FIG. 3, there is no barrier film layer 22.

Figure 5:
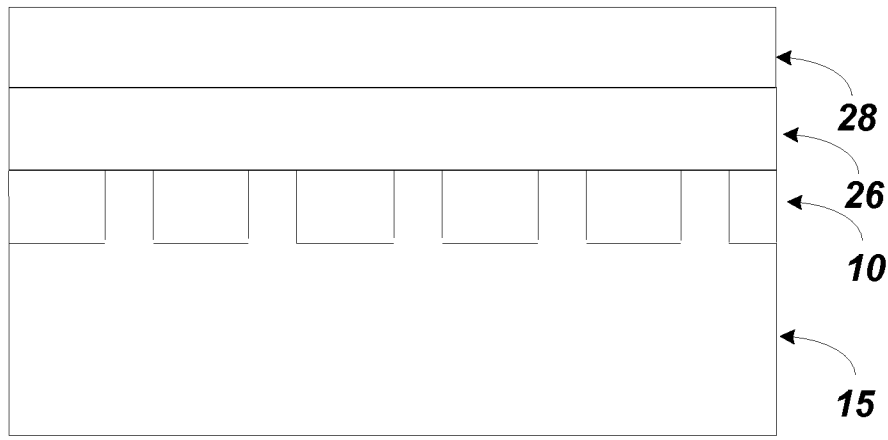
FIG. 5 provides another cross-sectional view of a preferred multilayer laminate construction herein.

FIG. 5 also illustrates another cross-sectional view of a preferred multilayer laminate construction herein again having fiber of foam layer 15 and perforated electromagnetic shield layer 10 as described above for FIG. 3. This then followed by the use of an adhesive tie layer 26 which can be sourced from polyethylene, polyamide, amorphous poly-alpha-olefin (APAO) polymer, and polyester, at a thickness in the range of 0.1 mm to 1.5 mm and at a basis weight in the range of 10 $g/m^2$ to 700 $g/m^2$. The top layer preferably comprises a needled carpet layer at a thickness of 2.0 mm to 12.5 mm at a basis weight in the range of 200 $g/m^2$ to 2000 $g/m^2$. As noted above, when layer 15 is a foam layer, it will adhere in this embodiment during foam formation to the perforated metallic electromagnetic shield layer 10 as well as the adhesive tie layer 26.

Figure 6:
FIG. 6 provides another cross-sectional view of a preferred multilayer laminate construction herein.

FIG. 6 illustrates one other cross-sectional view of a preferred multilayer laminate construction herein. In this preferred embodiment the multilayer laminate again has a fiber or foam layer 15 as described above in FIG. 3. This then is followed by a tie layer 26 as described above in FIG. 5, followed by the perforated electromagnetic shield layer 10. This then is followed by a needled carpet layer 28 as again described in FIG. 5.

The multilayer laminate constructions described herein that included the perforated metallic electromagnetic shield layer 10 were tested and observed to reduce the electromagnetic field by at least 70%, more preferably in the range of 70% to 80%. The test method utilized was the Narda ELT-400 protocol to measure the effectiveness of a sinusoidal current of 100 KHz and 4$A_{rms}$ (amps root mean square). The Narda ELT-400 protocol is reference to the use of a Nardas ELT-400 Exposure Level Tester for measurement of magnetic fields.

As alluded above, the multilayer laminate herein including the perforated metallic shield layer 10 is preferably utilized in the form of a carpet or textile product that can be used in electric vehicular flooring. As may be appreciated, in manufacture, the perforated metallic layer, aside from providing a relatively lightweight solution for electromagnetic shielding, also provides, during manufacture, openings for the foam to flow through to attach to the upper scrim layer. Such advantageously serves to assist in immobilization of the perforated metallic shield layer within the multi-layer laminate construction, while as noted, providing a metallic layer that can still operate to provide sufficient electromagnetic shielding for electric vehicle OEM requirements. The present invention therefore provides a multilayer laminate, suitable for electric vehicular flooring systems, that provides a relatively lightweight part, optimized manufacturability, while offering the ability to reduce or eliminate unwanted electromagnetic field propagation within the vehicle.

What is claimed is:

1. A multilayer laminate construction for electric vehicle flooring comprising:
    a foam or fiber decoupling layer;
    a perforated metallic electromagnetic shield layer comprising a metallic sheet having a thickness of 0.025 mm to 1.5 mm and a plurality of openings having a diameter in the range of 1.5 mm to 10.0 mm;
    a layer of tufted carpet or needled carpet; and
    wherein said multilayer construction provides electromagnetic shielding in said electric vehicle flooring.

2. The multilayer laminate construction for electric vehicle flooring of claim 1 wherein said foam or fiber decoupling layer comprises foam at a density in the range of 10 $g/m^3$ to 150 $kg/m^3$ and a thickness of 1.0 mm to 100.0 mm.

3. The multilayer laminate construction for electric vehicle flooring of claim 1 wherein said layer of tufted carpet or needled carpet has a thickness in the range of 2.0 mm to 12.5 mm.

4. The multilayer laminate construction for electric vehicle flooring of claim 1 wherein said foam or fiber decoupling layer comprises fiber and has a density in the range of 30 kg/m³ to 150 kg/m³ and a thickness of 1.0 mm to 100.0 mm.

5. The multilayer laminate construction for electric vehicle flooring of claim 1 wherein said layer of tufted carpet or needled carpet is tufted carpet at a thickness of 2.0 mm to 12.5 mm at a basis weight of 230 g/m² to 700 g/m².

6. The multilayer laminate construction for electric vehicle flooring of claim 1 wherein said multilayer laminate reduces the electromagnetic field by at least 70% when tested via the Narda ELT-400 protocol with a sinusoidal current of 100 KHz and $4A_{rms}$.

7. A method of forming a multilayer laminate construction for electric vehicle flooring comprising:
   providing a perforated metallic electromagnetic shield layer having a first side and a second side and having a plurality of openings;
   providing a layer of tufted carpet or needled carpet;
   forming a foam decoupling layer on a first side of said perforated electromagnetic shield layer where the foam penetrates said openings in said perforated electromagnetic shield layer.

8. The method of claim 7 wherein said foam penetrates said openings in said perforated electromagnetic shield layer and adheres to said layer of tufted carpet or needled carpet.

9. The method of claim 7 further including a barrier film layer positioned between said tufted carpet or needled carpet, wherein said foam penetrates said openings in said perforated electromagnetic shield layer and adheres to said barrier film layer.

10. The method of claim 7 further including a bonding layer positioned between said tufted carpet or needled carpet, wherein said foam penetrates said openings in said perforated electromagnetic shield layer and adheres to said bonding layer.

11. The method of claim 7 further including an adhesive tie layer positioned between said tufted carpet or needled carpet, wherein said foam penetrates said openings in said perforated electromagnetic shield layer and adheres to said adhesive tie layer.

12. The method of claim 7 wherein said perforated metallic electromagnetic shield layer has a thickness of 0.025 mm to 1.5 mm and said openings have a diameter in the range of 1.5 mm to 10.0 mm.

13. The method of claim 7 wherein said foam decoupling layer comprises foam at a density in the range of 10 g/m³ to 150 kg/m³ and a thickness of 1.0 mm to 100.0 mm.

14. The method of claim 7 wherein said layer of tufted carpet or needled carpet has a thickness in the range of 2.0 mm to 12.5 mm.

15. The method of claim 14 wherein said layer of tufted carpet or needled carpet is tufted carpet at a thickness of 2.0 mm to 12.5 mm at a basis weight of 230 g/m² to 700 g/m².

16. The method of claim 7 wherein said multilayer laminate reduces the electromagnetic field by at least 70% when tested via the Narda ELT-400 protocol with a sinusoidal current of 100 KHz and $4A_{rms}$.

17. A multilayer laminate construction for electric vehicle flooring comprising:
   a foam decoupling layer;
   a perforated metallic electromagnetic shield layer having a plurality of openings;
   a layer of tufted carpet or needled carpet; and
   wherein said multilayer construction provides electromagnetic shielding in said electric vehicle flooring and said foam is present in said plurality of openings in said perforated metallic electromagnetic shield layer.

18. The multilayer laminate construction for electric vehicle flooring of claim 17 wherein said perforated metallic electromagnetic shield layer has a thickness of 0.025 mm to 1.5 mm and said openings have a largest diameter in the range of 1.5 mm to 10.0 mm.

19. The multilayer laminate construction for electric vehicle flooring of claim 17 wherein said foam or fiber decoupling layer comprises foam at a density in the range of 10 g/m³ to 150 kg/m³ and a thickness of 1.0 mm to 100.0 mm.

20. The multilayer laminate construction for electric vehicle flooring of claim 17 wherein said layer of tufted carpet or needled carpet has a thickness in the range of 2.0 mm to 12.5 mm.

21. The multilayer laminate construction for electric vehicle flooring of claim 17 wherein said foam or fiber decoupling layer comprises foam and said foam is present in said plurality of openings in said perforated metallic electromagnetic shield layer.

22. The multilayer laminate construction for electric vehicle flooring of claim 17 wherein said foam or fiber decoupling layer comprises fiber and has a density in the range of 30 kg/m³ to 150 kg/m³ and a thickness of 1.0 mm to 100.0 mm.

23. The multilayer laminate construction for electric vehicle flooring of claim 17 wherein said layer of tufted carpet or needled carpet is tufted carpet at a thickness of 2.0 mm to 12.5 mm at a basis weight of 230 g/m² to 700 g/m².

24. The multilayer laminate construction for electric vehicle flooring of claim 17 wherein said multilayer laminate reduces the electromagnetic field by at least 70% when tested via the Narda ELT-400 protocol with a sinusoidal current of 100 KHz and $4A_{rms}$.

\* \* \* \* \*